United States Patent
McCarthy et al.

(10) Patent No.: US 7,505,748 B2
(45) Date of Patent: Mar. 17, 2009

(54) LINEAR VOLTAGE CONTROLLED VARIABLE ATTENUATOR WITH LINEAR DB/V GAIN SLOPE

(75) Inventors: Daniel P. McCarthy, Elk Grove Village, IL (US); Lawrence E. Connell, Naperville, IL (US); Neal W. Hollenbeck, Palatine, IL (US)

(73) Assignee: Freescale Semicondductor, Inc., Austin (TW)

( * ) Notice: Subject to any disclaimer, the term of this patent is extended or adjusted under 35 U.S.C. 154(b) by 456 days.

(21) Appl. No.: 11/238,657

(22) Filed: Sep. 28, 2005

(65) Prior Publication Data

US 2007/0072569 A1    Mar. 29, 2007

(51) Int. Cl.
*H04B 7/00* (2006.01)
(52) U.S. Cl. .................. 455/249.1; 455/134; 455/136; 455/138; 455/194.2; 455/183.2; 333/81 R
(58) Field of Classification Search .............. 455/249.1, 455/134, 136, 138, 194.2, 183.2, 184.1, 192.3; 333/81 R
See application file for complete search history.

(56) References Cited

U.S. PATENT DOCUMENTS

| | | | |
|---|---|---|---|
| 3,977,291 A | 8/1976 | Southard | |
| 4,839,611 A * | 6/1989 | Kukulinsky | 330/284 |
| 4,864,162 A | 9/1989 | Maoz | |
| 4,875,023 A * | 10/1989 | Maoz | 333/81 R |
| 7,302,241 B2 * | 11/2007 | Koenig | 455/136 |
| 2005/0054314 A1 | 3/2005 | Dobrovolny | |

OTHER PUBLICATIONS

International Search report for corresponding PCT Application No. PCT/US06/37174 dated Aug. 28, 2007.

* cited by examiner

*Primary Examiner*—Sanh D Phu
(74) *Attorney, Agent, or Firm*—Brinks Hofer Gilson & Lione

(57) ABSTRACT

A variable attenuator and method of attenuating a signal is presented. The variable attenuator contains an input that receives an input signal to be attenuated. A voltage divider between a resistor and parallel MOSFETs provides the attenuated input signal. The MOSFETs have different sizes and have gates that are connected to a control signal through different resistances such that the larger the MOSFET, the larger the resistance. The control signal is dependent on the output of the attenuator. The arrangement extends the linearity of the attenuation over a wide voltage range of the control signal and decreases the intermodulation distortion of the attenuator.

15 Claims, 3 Drawing Sheets

LINEAR VOLTAGE CONTROLLED VARIABLE ATTENUATOR WITH LINEAR DB/V GAIN SLOPE

TECHNICAL FIELD

The present application relates to a variable attenuator. More specifically, the present application relates to a voltage controlled variable attenuator having a linear gain slope.

BACKGROUND

Televisions contain a number of components including a screen such as a cathode ray tube (CRT), liquid crystal display (LCD) or plasma display, as well as circuitry to receive a signal to be displayed and display the signal on the screen. This circuitry includes a tuner that tunes to a particular carrier (frequency) to receive the desired signal.

Television tuners receive carriers over a predetermined range, e.g. from 50 MHz to 860 MHz over some standards. This is a relatively wide range of frequencies compared to other electronic devices, such as cellular telephones, which operate over a frequency range of 100 MHz or so. The incoming signal power to a tuner can vary by many orders of magnitude depending on a variety of factors such as distance of the tuner to the signal source or the environmental conditions, for example. Moreover, the signal strength may vary continuously if the television is mobile as the television is being transported.

However, the change in signal strength is problematic as before the signal is provided to an output of the tuner, it is amplified by an amplifier having a constant gain. In this case, the signal strength provided to the amplifier is adjusted so that the signal is within the range of the amplifier. That is, if the amplitude of the signal is too large, the amplifier will distort the peaks of the signal and thus degrade the output of the tuner. Accordingly, there exists a need to continuously control the gain of the tuner such that a constant output power level is achieved.

To control the gain of the tuner, a variable attenuator is usually provided between the input signal and the amplifier. It is desirable to have a continuous gain control using an analog control voltage. Likewise, it is desirable to have the slope of the gain linear in dB/V. However, the gain variability function adds complexity, noise, and distortion problems. For example, a tradeoff exists between the sensitivity of the attenuation control voltage and the attenuation range. For increasing attenuation ranges, it becomes more difficult to maintain a linear in dB/V gain slope.

DETAILED DESCRIPTION OF THE EMBODIMENTS

A variable attenuator and tuner are provided in which the variable attenuator is highly linear, has a large automatic gain control range, and is easily implemented. In addition, the variable attenuator provides a constant attenuation slope and an improvement in intermodulation distortion. This enables integration of an automatic gain control amplifier into the tuner, which reduces cost and increases flexibility in design of the tuner.

Figure 1:
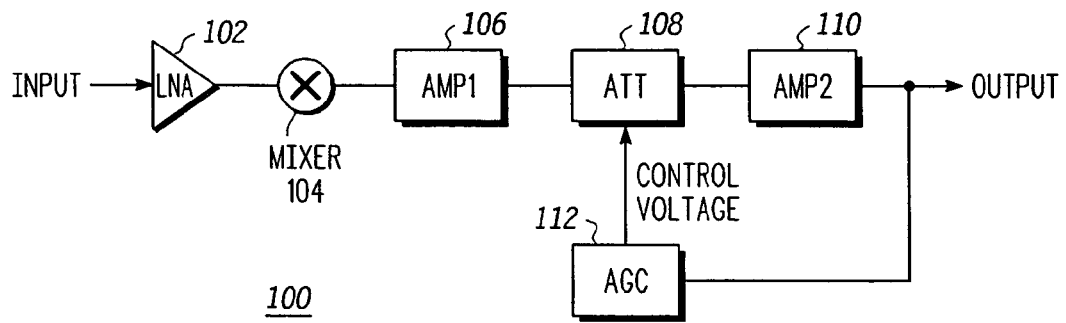
FIG. 1 is a block diagram of circuitry in a tuner in accordance with an embodiment of the invention.

FIG. 1 illustrates a block diagram of circuitry in a tuner in accordance with an embodiment. Although other circuitry may be present, such as an analog-to-digital (A/D) converter or coupling capacitors, such circuitry is not shown for clarity. As illustrated, the tuner 100 contains a low noise amplifier (LNA) 102, having an input connected to the input of the tuner 100. An input of a mixer 104 is connected to an output of the LNA 102. An output of the mixer 104 is connected to an input of a first amplifier (AMP1) 106. An output of the first amplifier 106 is, in turn, connected to an input of a variable attenuator (ATT) 108. An input of a second amplifier (AMP2) 110 is connected to an output of the variable attenuator 108. An output of the second amplifier 110 is connected to an input of an automatic gain controller (AGC) 112, whose output is connected to another input of the variable attenuator 108. The output of the second amplifier 110 is also supplied as an output of the tuner 100.

A signal of a predetermined frequency range (e.g. from 50 MHz to 860 MHz) is supplied to the LNA 102 through the input of the tuner 100. The signal is linearly amplified by the LNA 102 before being passed to the mixer 104. The mixer 104 down-converts the linearly amplified signal to baseband (0 Hz) or near baseband before supplying the down-converted signal to the first amplifier 106. The first amplifier 106 amplifies the down-converted signal by a predetermined amount and then supplies the amplified signal to the variable attenuator 108. The variable attenuator 108 attenuates the amplified signal by an amount determined by the control voltage supplied from the AGC 112. The attenuated signal is then amplified by another predetermined amount in the second amplifier 110. In the AGC loop, the AGC 112 receives a feedback signal of the amplified signal from the second amplifier 110 and uses the feedback signal to adjust the control voltage, and thus, the amount of attenuation. For example, if the output of the tuner 100 is within a predetermined voltage from the maximum output voltage, the AGC 112 controls the variable attenuator 108 to increase the amount of attenuation while if the output of the tuner 100 is within a predetermined voltage from the minimum output voltage, the AGC 112 controls the variable attenuator 108 to decrease the amount of attenuation. The minimum and maximum output voltages may be determined by the module to which the attenuated output signal is supplied or some other criterion determined by the system of which the variable attenuator is a part.

Figure 2:
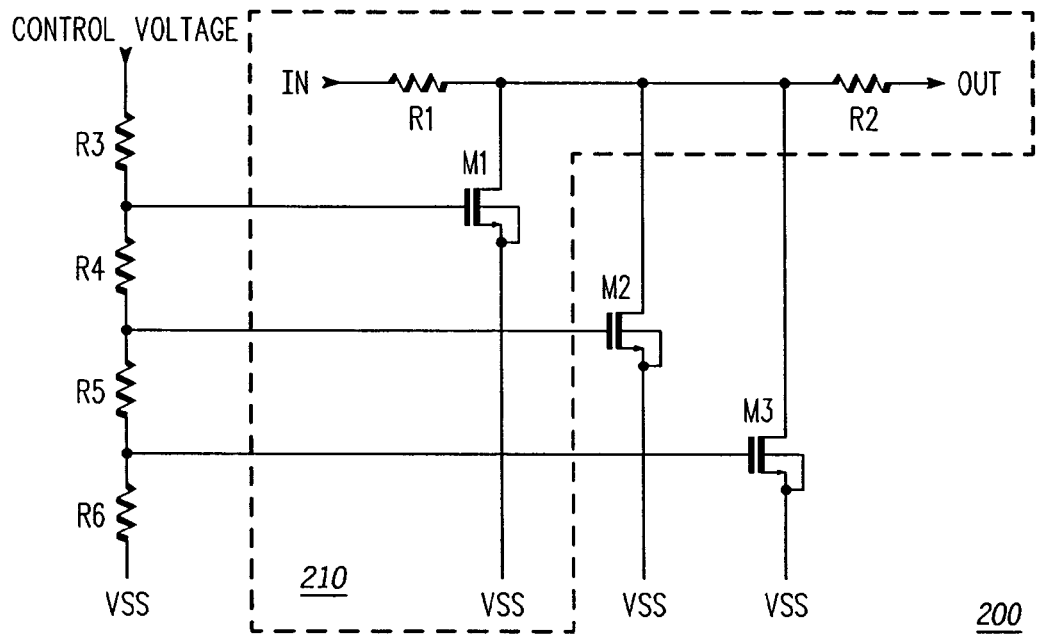
FIG. 2 illustrates an embodiment of the variable attenuator in accordance with an embodiment of the invention.
Figure 3:
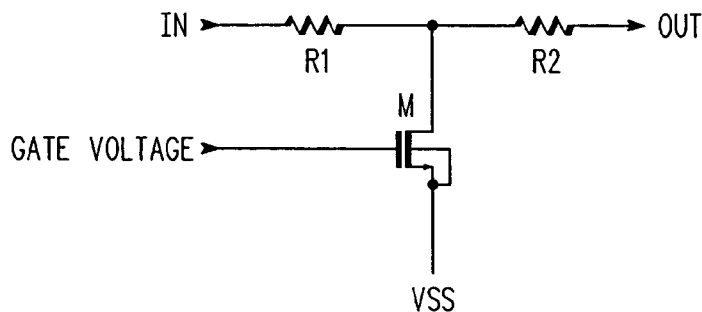
FIG. 3 is an enlargement of input section 210 of the tuner in FIG. 2.

FIG. 2 illustrates one example of the variable attenuator 108 in FIG. 1. FIG. 3 is an enlargement showing input section 210 of the variable attenuator 200 shown in FIG. 2. As shown, the variable attenuator 210 contains a pair of first elements (shown and hereinafter described as resistors R1, R2) and a single second element (shown and hereinafter described as MOSFET M). The resistors R1, R2 are connected in series between the input IN and the output OUT of the variable attenuator 210. The shunt MOSFET M is connected between a node between the resistors R1, R2 and ground Vss. The substrate of the MOSFET M is grounded. A control voltage is connected to the control terminal (gate) of the MOSFET M. The MOSFET M acts as a shunt resistor, having a large resistance when off (i.e. when the channel between the source and drain regions is closed) and having a substantially smaller resistance when on (i.e. when the channel is open). For example, when the MOSFET M is off, the resistance may be 10R1, while when the MOSFET M is on, the resistance may be 0.1R1. Thus, when the MOSFET M is off, the voltage at the node between the resistors R1, R2 is maximized and when the MOSFET M is on, the voltage at the node is minimized. Accordingly, the attenuation varies from a relatively small amount when the MOSFET M is off to a relatively large value when the MOSFET M is on.

However, while the control voltage is able to vary the attenuation of the variable attenuator of FIG. 3, the slope of the attenuation curve is linear over only a small range. As the MOSFET turns on, the slope of the attenuation curve starts to increase. As the control voltage increases further, this slope reaches a maximum. Unfortunately, the slope does not stay constant as the control voltage keeps increasing. At a certain control voltage, the slope magnitude of the attenuation versus the control voltage curve begins to decrease. This can be seen as the drain-to-source resistance Rds of the MOSFET is given by (1).

$$R_{ds} = \frac{L}{\mu C_{ox} W (V_{gs} - V_T)} \quad (1)$$

In this equation, L is the length of the channel, μ is the mobility of the carriers, $C_{ox}$ is the capacitance formed across the oxide, W is the channel width, Vgs is the gate-to-source voltage, and Vt is the threshold voltage. Equation (1) shows that the resistance decreases as Vgs increases. The attenuation of the input signal (in dB) for the circuit shown in FIG. 2 is given by (2).

$$\text{Atten (dB)} = 20 * \log\left(\frac{R_{ds}}{R_{ds} + R}\right) \quad (2)$$

Where R is R1 in FIG. 3. This equation can be simplified and rewritten as shown by (3).

$$\text{Atten (dB)} = 20 * \log\left(\frac{1}{1 + RK(V_{gs} - V_T)}\right) \text{ where } K = \frac{\mu C_{ox} W}{L} \quad (3)$$

If (3) is differentiated with respect to Vgs, the result is shown in (4).

$$\frac{\partial \text{Atten (dB)}}{\partial V_{gs}} = -\frac{20 RK \log e}{1 + RK(V_{gs} - V_T)} \quad (4)$$

If the source is grounded and the gate is supplied with the control voltage from the control terminal, as is the case in the arrangement of FIG. 3, (4) shows that for a control voltage just above $V_T$, the slope of the attenuation versus control voltage curve is approximately −20 RKloge. As the control voltage rises, the slope decreases towards zero. This decrease in attenuation slope magnitude limits the attenuation range.

Figure 4:
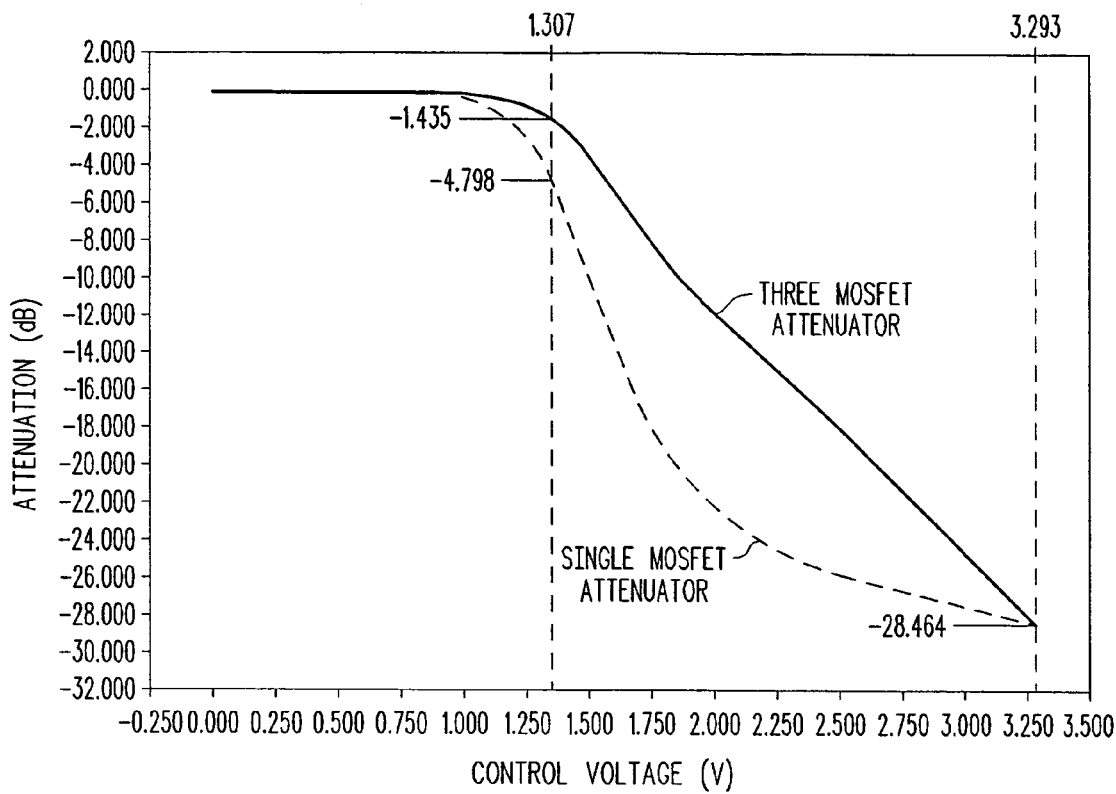
FIG. 4 is a plot of attenuation verses control voltage for a single MOSFET variable attenuator and three MOSFET variable attenuator in accordance with an embodiment of the invention.

The attenuation range can be increased if the sensitivity is increased. FIG. 4 is a graph showing the slope of the attenuation for the embodiment of FIG. 2 and if only input section 210 in FIG. 2 is present in the variable attenuator (i.e. only a single MOSFET is present). As illustrated in FIG. 4, the slope of the attenuation for the single MOSFET case is dB linear over only a relatively small range of voltages, from about 1.3V to about 1.6V.

For a single MOSFET attenuator, a tradeoff exists between the attenuation slope and the attenuation range. By increasing the size (W/L ratio) of the MOSFET, the difference in MOSFET resistance when the MOSFET is on and when the MOSFET is off increases. Accordingly, the input signal can be attenuated many orders of magnitude between the on and off states of the MOSFET. As a result, the sensitivity of the attenuation control correspondingly increases. In other words, for very small changes in the gate voltage, there will be a large change in the attenuation of the input signal. On the other hand, by decreasing the size of the MOSFET, the difference in MOSFET resistance when the MOSFET is on and when the MOSFET is off decreases. Accordingly, the input signal can be attenuated by a comparatively smaller amount. This correspondingly decreases the sensitivity of the attenuation control so that for large changes in the gate voltage, only a relatively small change in the attenuation of the input signal occurs.

Thus, if only a single MOSFET is used as arranged in FIG. 3, a fixed attenuation range is obtained given a particular attenuation slope. One limitation as to the applications in which the variable attenuator may be used is the linearity of the attenuation curve in dB/V. The bandwidth of the AGC loop can be increased with increasing linearity of the attenuation slope. As discussed above, this may be of more importance in mobile applications, where the received signal strength can vary quickly over time. However, the linearity of the variable attenuator is also degraded by the presence of the shunt MOSFET. When the control voltage is near the threshold voltage of the MOSFET, the MOSFET is in the saturation region (in which $V_{gs} > V_t$ and $V_{ds} > V_{gs} - V_t$, where $V_{ds}$ is the drain-to-source voltage) and exhibits non-linear behavior. As the voltage increases, the gate-to-source voltage of the MOSFET increases until the MOSFET enters the linear region (in which $V_{gs} > V_t$ and $V_{ds} < V_{gs} - V_t$). If an increased attenuation range is desired, a device of increased size is used. However, as the MOSFET size increases, the linearity of the variable attenuator decreases when the control voltage is near the threshold voltage.

In more detail, FIG. 2 illustrates one embodiment of the variable attenuator. As shown, the variable attenuator 200 contains a pair of series resistors R1 and R2 connected between the input IN and the output OUT of the variable attenuator 200. A resistor chain R3, R4, R5, R6 is connected between the control voltage and ground Vss. The resistors R3, R4, R5, R6 act as voltage dividers between the control voltage and ground Vss. The nodes between the adjacent resistors in the resistor chain R3, R4, R5, R6 are connected to control terminals of the devices M1, M2, M3. Thus, each node between adjacent resistors R3, R4, R5, R6 provides a predetermined voltage that is dependent on the control voltage (more specifically, a ratio of the difference between the control voltage and Vss) to the terminals of the devices M1, M2, M3. The resistors in the resistor chain R3, R4, R5, R6, similar to the resistors R1, R2 between the input IN and the output OUT, may have any desired resistance. For example, the resistance of resistor R2 may be 0.

As described above, the MOSFETs M1, M2, M3 act as shunts for signals passing between the input IN and the output OUT of the variable attenuator 200, with the gates of the MOSFETs M1, M2, M3 connected to the nodes between the adjacent resistors in the resistor chain R3, R4, R5, R6. Either n-channel or p-channel MOSFETs may be used, although n-channel MOSFETs may be more desirable at least as a smaller device can be used to achieve the same drain-to-source resistance. The MOSFETs M1, M2, M3 are connected in parallel between the series resistors R1, R2.

The MOSFETs M1, M2, M3 are controlled by the voltage at the associated nodes of the resistor chain R3, R4, R5, R6. This voltage may be a continuous analog voltage or a discrete digital voltage. As described above, as the control voltage increases, the drain-to-source resistance of each MOSFET decreases from a relatively high resistance when the MOSFET is off continuously until it reaches a predetermined low resistance when the MOSFET is on. Thus, the input signal is attenuated by a voltage divider created by the series resistor pair R1, R2 and the MOSFETs M1, M2, M3. As the gates of the MOSFETs M1, M2, M3 are supplied with different voltages, which are all dependent on the control voltage, the MOSFETs M1, M2, M3 turn on at different times. In other words, the MOSFETs M1, M2, M3 turn on at different voltage levels of the control voltage.

In one embodiment, the MOSFETs M1, M2, M3 have different sizes. In some embodiments, although each of the channel lengths is the same, each of the channel widths of the MOSFETs M1, M2, M3 is W, 8W, and 32 W, respectively. By varying the sizes of the MOSFETs M1, M2, M3 and turning on the MOSFETs M1, M2, M3 at different voltage levels of the control voltage, a better tradeoff between attenuation range and attenuation slope can be obtained. As shown in FIG. 2, the larger the MOSFET, i.e. the larger the width, the smaller the voltage applied to the control terminal and thus the larger the control voltage to turn on the MOSFET. This arrangement permits the MOSFETs M1, M2, M3 to compensate for non-linearity. More specifically, the smaller MOSFETs remain in the linear region when the larger MOSFETs are in the saturation region. As the larger MOSFETs have smaller resistances than the smaller MOSFETs, and since the source/drain of the MOSFETs are connected in parallel, the effect of the saturation of the larger MOSFETs on the attenuation curve is decreased in significance by the smaller MOSFETs. This accordingly permits the attenuation to increase substantially linearly at higher control voltage levels. Thus, as the control voltage is related to the voltage from the tuner, as the voltage from the tuner increases, the amount of attenuation increases.

The operation of the variable attenuator 200 will be described with reference to the control voltage verses attenuation curve of FIG. 4. When operating, an input signal is supplied to the input IN. If the control voltage is 0 volts, the output voltage Vout is equal to the input voltage Vin. As the control voltage rises, MOSFET M1 will turn on first. The slope of the attenuation versus control voltage curve starts to increase to a maximum value determined essentially by the voltage divider of resistor R1 and the resistance of MOSFET M1. Eventually, the slope magnitude starts to decrease, as shown in equation (4), at which point MOSFET M2 starts to turn on. Thus, the attenuation slope stays substantially constant until the slope magnitude of the attenuation due to MOSFET M2 starts to decrease. At this point, it is desired to have MOSFET M3 start to turn on, etc.

The slope of the plot of the three MOSFET attenuator is substantially constant over a much broader range of control voltages compared to the single MOSFET variable attenuator. With judicious choice of the MOSFET size and resistor selection for both the resistor chain and the resistor R1 connected to the input of the variable attenuator, a particular constant attenuation slope can be achieved for many orders of magnitude of the attenuation. Thus, a desired attenuation range and sensitivity to the control voltage can be achieved simultaneously. The control voltage extends to a maximum of 3.3V. In the plot, a three MOSFET variable attenuator with different MOSFET sizes (M3>M2>M1) was designed to give the same attenuation range as a single MOSFET variable attenuator. The three MOSFET variable attenuator was also designed to have an attenuation curve slope of −14 dB/V. As can be seen, the single MOSFET variable attenuator is only dB/V linear for a small range of the control voltage, from about 1.3V to about 1.6V. The three MOSFET variable attenuator is dB/V linear with an approximate slope of −14 dB/V for a much larger control voltage range, from about 1.3V to about 3.3V. This more linear in dB/V attenuation slope allows for a larger bandwidth AGC loop. This enables the variable attenuator to be used in a mobile application where the received signal strength can vary quickly over time.

In addition, the intermodulation (IM) distortion products produced by the multiple MOSFET variable attenuator is significantly less than that of the single MOSFET variable attenuator. Since the first device to turn on has the smallest width (and thus has the smallest resistance), it does not have as negative of an effect on linearity as a larger device when the gate-to-source voltage is near threshold. As a larger MOSFET starts to turn on, the smaller MOSFET(s) is well into the linear region. Thus, the initial non-linearities associated with the drain-to-source resistance of the larger MOSFET is decreased due to the presence of the more linear drain-to-source resistance of the smaller MOSFET. In the plot of FIG. 4, the linearities of the variable attenuators were simulated and compared. For a constant output power level of −25 dBm, the linearity of the variable attenuators were observed at attenuation levels from −1 dB to −25 dB with a −1 dB step. The worst intermodulation distortion over the entire attenuation range for a constant output power of −25 dBm was −56.2 dB for the single MOSFET variable attenuator and −69.25 dB for the three MOSFET variable attenuator. Thus, the three MOSFET variable attenuator has an improved intermodulation distortion level of +13 dB over the single MOSFET variable attenuator as well as a more constant attenuation slope over the same attenuation range.

Figure 5:
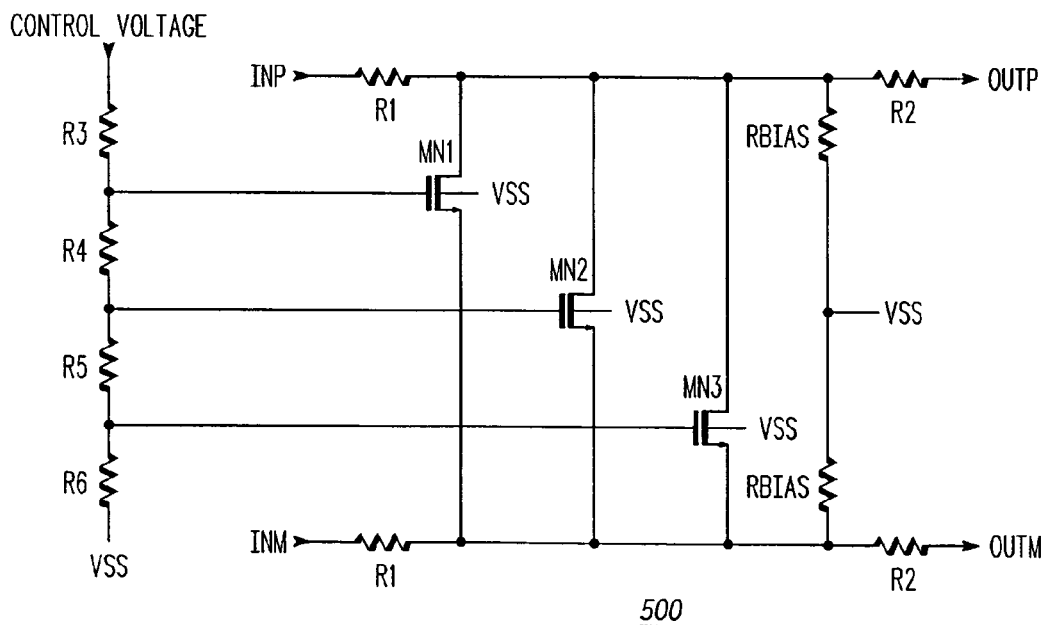
FIG. 5 illustrates an embodiment of the variable attenuator in accordance with an embodiment of the invention.

FIG. 5 illustrates another embodiment of the three MOSFET variable attenuator. As illustrated, the variable attenuator 500 is a differential variable attenuator containing a pair of series resistors R1 and R2 connected between each of the inputs INP, INM and the respective outputs OUTP, OUTM. A resistor chain R3, R4, R5, R6 is connected between the control voltage and ground Vss. The nodes between the adjacent resistors in the resistor chain R3, R4, R5, R6 are connected to gates of the respective MOSFETs M1, M2, M3. As before, the MOSFETs M1, M2, M3 have a channel width of W, 8W, and 32W, respectively. To balance the output signals, a pair of bias resistors RBIAS are connected in series with each other. The bias resistors RBIAS connected in parallel with the MOSFETs M1, M2, M3 are connected between the series resistors R1, R2. The node between the bias resistors RBIAS is connected to ground Vss.

Figure 6:
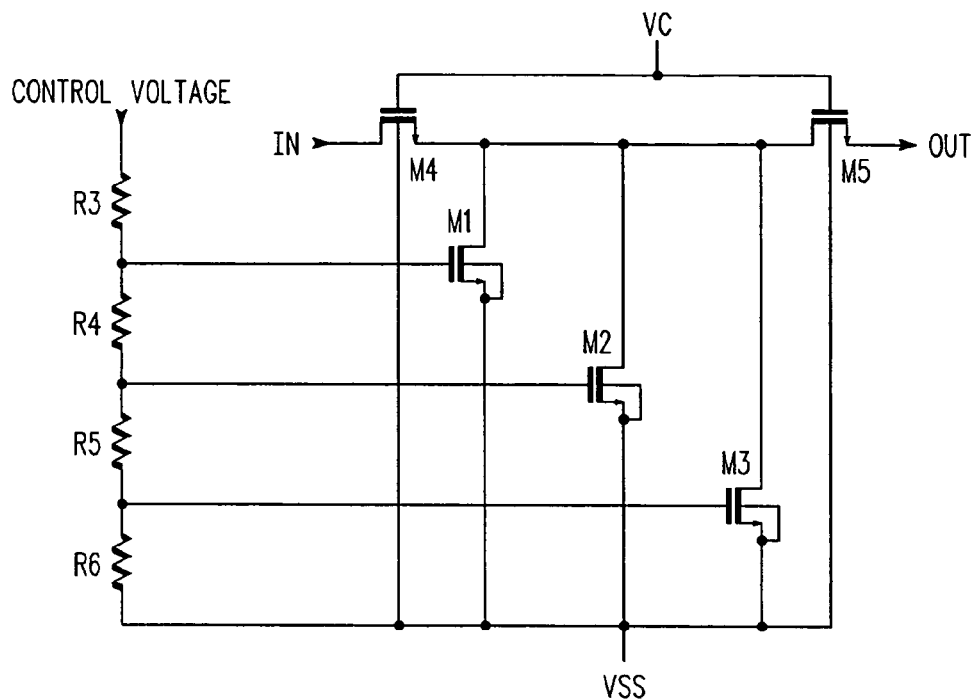
FIG. 6 illustrates an embodiment of the variable attenuator in accordance with an embodiment of the invention.

Although resistors have been described as the first element in FIG. 2, other devices may be used, as shown in the embodiment FIG. 6. The embodiment of FIG. 6 is identical to that of FIG. 2, except that the series resistors R1, R2 between the input IN and the output OUT of the variable attenuator have been replaced by MOSFETs M4, M5. The gates of the series MOSFETs M4, M5 are connected to a voltage Vc, and thus have a resistance dependent on the voltage Vc. The series MOSFETs M4, M5 have the same or different sizes and may have the same or different voltages applied to their gates. The voltage Vc may be constant or continuously or discretely variable.

Figure 7:
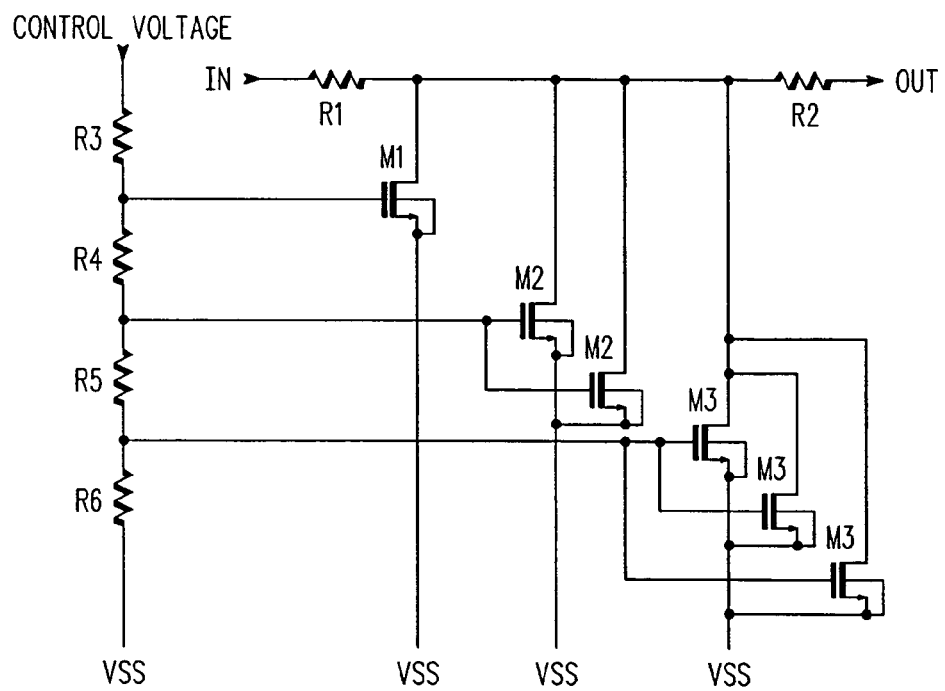
FIG. 7 illustrates an embodiment of the variable attenuator in accordance with an embodiment of the invention.

In other embodiments, any FET or other device(s) can be used, as long as it provides the desired attenuation characteristics. For example, MISFETs or variable resistors may be used rather than MOSFETs. By using CMOS, however, the current drain of the variable attenuator does not change substantially across the attenuation range. Similarly, although embodiments using three MOSFETs are shown, two or more MOSFETs can be used in different embodiments. Moreover, although the MOSFETs are described as having different sizes, and thus different drain-to-source resistances, two or more of the MOSFETs can have the same size while being connected to different nodes of the resistor chain or multiple MOSFETs can be connected to the same node. Thus, for example, one or more of the MOSFETs shown in the figures can be implemented by multiple MOSFETs, as shown in the variable attenuator 700 shown in FIG. 7. In one embodiment, the multiple MOSFETs have the same channel width to provide an effective channel width. In another embodiment, at least one of the multiple MOSFETs has a different channel width than another of the multiple MOSFETs.

Similarly, MOSFETs of various lengths can be used. However, as the length of the MOSFET increases, so does the minimum resistance. In addition, any number of resistors can be used. Other elements such as resistors may be connected in series with the MOSFETs, for example. A resistor that is much larger than the source-to-drain resistance may be disposed between the source and drain of the MOSFET. The variable attenuator may be used in devices other than tuners, for instance, cable modems, radios, cellular telephones, PDAs, laptop computers or other communication devices or systems that use a variable attenuator.

Accordingly, the specification and figures are to be regarded in an illustrative rather than a restrictive sense, and all such modifications are intended to be included within the scope of present invention. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

We claim:

1. A variable attenuator comprising:
    an input configured to receive an input signal to be attenuated;
    an output configured to supply the attenuated input signal;
    a first element disposed between the input and the output;
    a control terminal configured to receive a control signal;
    a plurality of resistors in series between the control terminal and ground; and
    a plurality of second elements connected to the control terminal such that each of the second elements changes attenuation between the input and the output differently with the control signal;
    wherein:
        the first element and the second elements form a voltage divider having an output node connected to the output of the variable attenuator; and
        control inputs of the second elements are connected to nodes between different resistors of the plurality of resistors.

2. The variable attenuator of claim 1, wherein each second element comprises a field effect transistor (FET).

3. The variable attenuator of claim 2, wherein the FETs are connected to the input and output in parallel.

4. The variable attenuator of claim 2, wherein each of the second elements has a different effective FET width.

5. The variable attenuator of claim 2, wherein a FET having a smaller effective width is connected to the control terminal through a smaller resistance than a FET having a larger effective width.

6. The variable attenuator of claim 1, wherein the second elements vary over different ranges of resistances.

7. The variable attenuator of claim 1, wherein the second elements are connected in parallel.

8. A method of attenuating a signal, the method comprising:
    providing a circuit of a first element and a plurality of parallel elements;
    providing an input signal to be attenuated to the circuit;
    providing a control signal to a voltage divider, the parallel elements connected to different nodes of the voltage divider, the control signal controlling attenuation of the input signal through controlling resistances of the parallel elements; and
    providing an attenuated output signal based on the input signal;
    wherein the first element and the parallel elements are connected in series, a node between the first element and the parallel elements connected to an output.

9. The method of claim 8, wherein the parallel elements vary over different resistance ranges.

10. The method of claim 9, wherein a parallel element that varies over a smaller range of resistance is connected to the control terminal through a smaller resistance than a parallel element that varies over a larger range of resistance.

11. The variable attenuator of claim 1, wherein the input is further configured to receive the input signal from a mixer.

12. The variable attenuator of claim 1, wherein the input is further configured to receive the input signal from a first amplifier.

13. The variable attenuator of claim 1, wherein the output is further configured to configured to supply the attenuated input signal to a second amplifier.

14. The variable attenuator of claim 13, wherein the control terminal is further configured to receive the control signal from the second amplifier.

15. The variable attenuator of claim 13, wherein the control terminal is further configured to receive the control signal from an automatic gain controller.

* * * * *